(12) United States Patent
Kawasumi

(10) Patent No.: US 7,558,924 B2
(45) Date of Patent: Jul. 7, 2009

(54) SYSTEMS AND METHODS FOR ACCESSING MEMORY CELLS

(75) Inventor: Atsushi Kawasumi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 190 days.

(21) Appl. No.: 11/047,502

(22) Filed: Jan. 31, 2005

(65) Prior Publication Data

US 2006/0171190 A1 Aug. 3, 2006

(51) Int. Cl.
*G06F 13/00* (2006.01)
(52) U.S. Cl. .................... 711/154; 711/167; 365/204
(58) Field of Classification Search .............. None
See application file for complete search history.

(56) References Cited

U.S. PATENT DOCUMENTS

| | | | | |
|---|---|---|---|---|
| 4,912,630 | A * | 3/1990 | Cochcroft, Jr. | 711/211 |
| 5,367,660 | A * | 11/1994 | Gat et al. | 711/3 |
| 5,530,835 | A * | 6/1996 | Vashi et al. | 711/147 |
| 6,118,729 | A | 9/2000 | Hirabayashi et al. | |
| 6,243,829 | B1 * | 6/2001 | Chan | 714/7 |
| 6,934,182 | B2 * | 8/2005 | Chan et al. | 365/154 |
| 2006/0129762 | A1 * | 6/2006 | Miller | 711/118 |

OTHER PUBLICATIONS

Coones et al. Implications of scaling on static RAM bit cell stability and reliability. Proc. SPIE vol. 1802, p. 10-23, Microelectronics Manufacturing and Reliability, [online], Jan. 1993 [retrieved on Mar. 14, 2007]. Retrieved from the Internet <URL: http://adsabs.harvard.edu/abs/1993SPIE.1802...10C>.*

Koopman, Philip. Memory Devices & Chip area. Carnegin Mellon. [online], Sep. 30, 1998 [retrieved on Mar. 14, 2007]. Retrieved from the Internet <URL: http://www.ece.cmu.edu/~ece548/handouts/09device.pdf>.*

* cited by examiner

*Primary Examiner*—Reginald G Bragdon
*Assistant Examiner*—Larry T Mackall
(74) *Attorney, Agent, or Firm*—Law Offices of Mark L. Berrier

(57) ABSTRACT

Systems and methods for accessing data in a memory, where a register is provided to temporarily store data from a write operation and to make the data available for read operations that are performed immediately following the write operation and are directed to the same data. In one embodiment, a memory system includes an array of a first type of memory cells and a register having cells of a second type. The second type of cells is designed to stabilize data more quickly than the first type. Data is written concurrently into the memory array and the register. When a read operation is directed to the location of an immediately preceding write operation, the data is read from the register. When a read operation is directed to a location that is not coincident with an immediately preceding write operation, the data is read from the memory array.

15 Claims, 6 Drawing Sheets

SYSTEMS AND METHODS FOR ACCESSING MEMORY CELLS

BACKGROUND

1. Field of the Invention

The invention relates generally to data storage, and more particularly to systems and methods for reducing malfunctions due to memory cell instability.

2. Related Art

Computer systems and other devices typically need to have means for storing information. These means may include persistent storage devices for large amounts of data, as well as memory systems for storing data that the computer or other device is currently using (i.e., RAM.)

RAM is typically used as the working memory of a device. RAM is used by devices to store data that needs to be accessible by a processor, and also needs to be modifiable. There is a great demand for RAM in computers and other electronic devices because the more RAM a device has, the more data can be readily accessible to the device's processor. For example, in a computer, the availability of more RAM enables the computer to execute more (or larger) software applications without having to swap data between RAM and a persistent storage device, such as a hard disc drive.

There are various different types of RAM. For example, dynamic RAM, or DRAM, has often been used in computers. The "dynamic" aspect of DRAM refers to the fact that DRAM memory cells need to be periodically refreshed in order to maintain the data which is stored in the cells. If the DRAM cells are not refreshed, the data will be lost. Static RAM, or SRAM, is another type of memory that is often used in computers. That "static" aspect of SRAM refers to the fact that SRAM cells do not have to be refreshed in the same manner as DRAM cells.

SRAM memory has a number of advantages over DRAM memory. As noted above, SRAM cells do not have to be refreshed in order to maintain the data that is stored in them. Additionally, SRAM is typically much faster than DRAM. For example, typical SRAM cells may have access times of about less than 1 nanosecond, while DRAM cells may have access times closer to 60 nanoseconds. Further, SRAM memories do not require pauses between accesses, so the cycle time to access SRAM cells is typically much shorter than the cycle time for accessing DRAM cells.

Although it has a number of advantages, SRAM memory also has some disadvantages. For instance, SRAM memory cells may be somewhat unstable. That is, the data in the cells may actually be corrupted when the cells are read. This problem arises from the fact that SRAM cells are read by coupling the cells to pre-charged bit lines and allowing the cells to pull down these bit lines. Just as the SRAM cell pulls the voltages on the bit lines down, the bit lines pull the voltages of the SRAM cells up. A low voltage corresponding to a "0" stored in the cell may be pulled up high enough that the data in the cell may be ambiguous, or may flip-flop so that the "0" becomes a "1."

The problem of instability in SRAM memory cells is aggravated by the scaling of memory devices. As semiconductor technologies advance and it becomes possible to make circuit components such as transistors smaller, the components may have greater variations in their characteristics. Transistors in particular experience greater variations in characteristics such as threshold voltage. There is therefore a greater likelihood that the individual transistors that make up a typical SRAM memory cell will not be identical to each other. As a result, the transistors (which are typically configured somewhat symmetrically) may not operate identically, and the cell may become unstable.

The instability of SRAM memory cells is further aggravated by increases in the speed at which the memory cells are operated. Because the demand for greater processing power, the speeds at which data processors and memories are operated are constantly increasing. This may cause problems in SRAM cells because, as these cells are operated at higher speeds/frequencies, less time is available during write operations to pull the voltages of the cells to the appropriate levels (i.e., to write data to the cells.) It may therefore take longer for voltage levels within the cells to stabilize. Until these voltage levels stabilize, the cells may be susceptible to data corruption caused by subsequent read operations.

It would therefore be desirable to provide systems and/or methods for reducing or eliminating data corruption that may be caused by read operations on memory cells in which voltage levels corresponding to the data stored therein have not yet stabilized.

SUMMARY OF THE INVENTION

One or more of the problems outlined above may be solved by the various embodiments of the invention. Broadly speaking, the invention includes systems and methods for accessing data in a memory, where a register is provided to temporarily store data from a write operation and to make the data available for read operations that are performed immediately following the write operation and are directed to the same data.

In one embodiment, a memory system includes an array of memory cells of a first type and a register having memory cells of a second type. The second type of memory cells are designed so that data stabilizes in these cells more quickly than in the first type of memory cells. The memory system also includes control circuitry coupled to the memory array and to the register. The control circuitry is configured to cause data that is written into the memory array to be concurrently written into the register. Each time data is written, the data previously stored in the register is overwritten. Then, when a read operation is directed at least in part to a memory location to which an immediately preceding write operation was directed, the data is read from the register. When a read operation is directed to a memory location that is not coincident with the location of an immediately preceding write operation, the data is read from the memory array. When a read operation is directed to a memory location that coincides with the location of the last write operation, but the write operation was performed more than one processing cycle before the read operation, the data can be read from either the register or the memory array.

In one embodiment, the memory array and the register of the memory system comprise SRAM cells. The second type of memory cells may have a design which is almost identical to the design of the first type of memory cells, but which is scaled up (larger) and therefore more stable (because of the larger channel area of the transistors, which results in lower threshold voltage variation.) The control circuitry may include a multiplexer that is configured to receive a first data input from the array and a second data input from the register and to output a selected one of these inputs. The control circuitry may also include a comparator which is configured to compare a first address associated with the read operation to a second address associated with the preceding write operation, and to control the multiplexer to select either the register input or the array input based on the result of the comparison. The control circuitry may also include a latch configured to store the write address when the preceding write operation is performed.

An alternative embodiment may comprise a method in which a write operation is performed in a first processing cycle and a read operation is performed in a second processing cycle. During the write operation, data is stored both in a first set of memory cells in a memory array and concurrently in a register. The memory cells of the register are designed so that data stabilizes in these cells before the data stabilizes in the cells of the memory array. During the read operation, if the read operation is directed to the first set of memory cells in the memory array (or a portion of these cells) the data for the read operation is retrieved from the register instead of the memory array. If the read operation is not directed to any of the first set of memory cells in the memory array, the data for the read operation is retrieved from the memory array.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
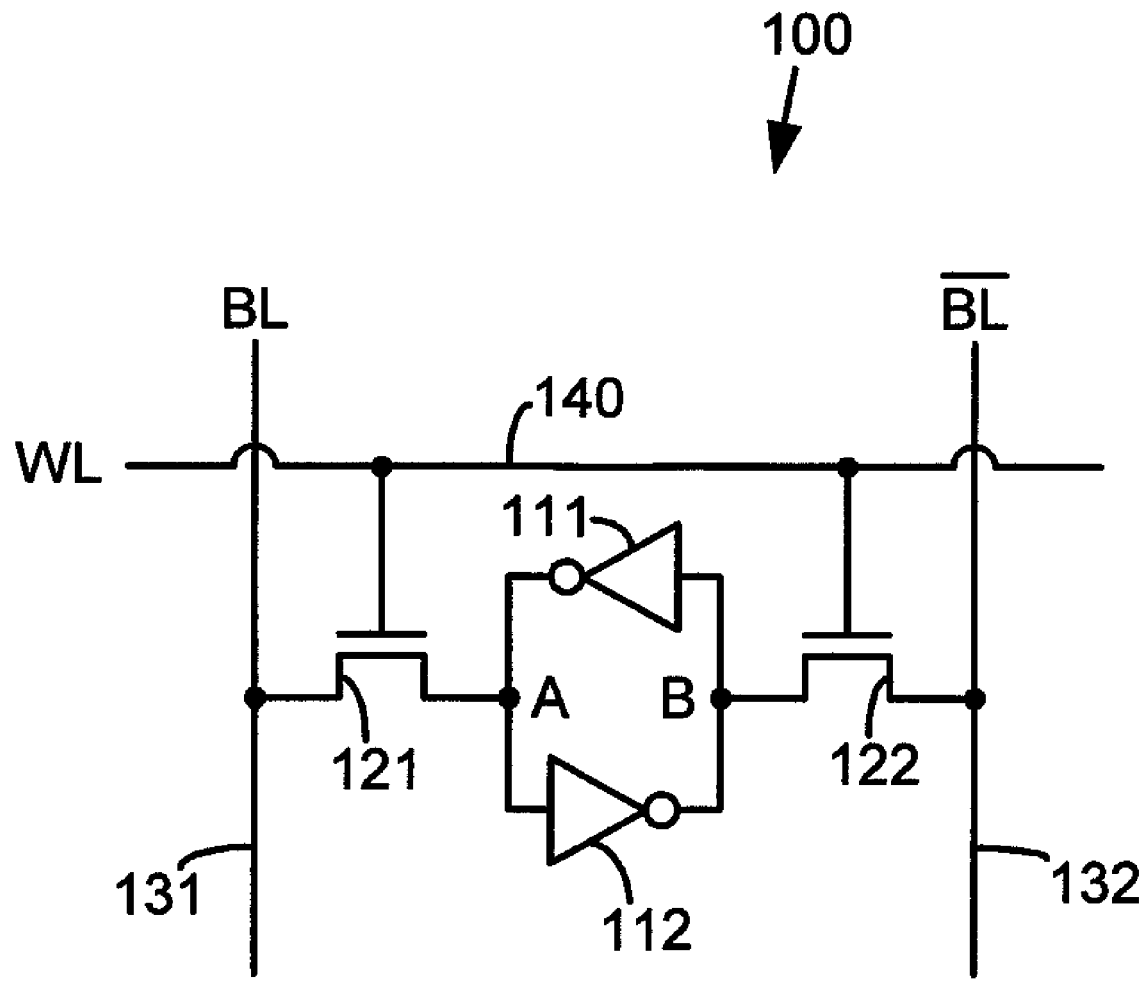
FIG. 1 is a diagram illustrating the structure of an exemplary SRAM memory cell in accordance with the prior art.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for accessing data in a memory, where a register is provided to temporarily store data from a write operation and to make the data available for read operations that are performed immediately following the write operation and are directed to the same data.

In one embodiment, a memory system comprises an array of memory cells and a register. Because of the size and the speed at which the memory cells are operated, more than a single cycle is required for a data value stored in any one of the cells to become stable. Thus, if data is written to a particular address (a particular memory cell) in one cycle and the same address (memory cell) is read in the next cycle, the data may not have stabilized, and the retrieved data may contain errors. The register, on the other hand, is designed so that data stored in the register stabilizes within a single cycle. Consequently, if data is written to the register in one cycle and then is read in the next cycle, the data will have stabilized, and the retrieved data will not contain any errors resulting from instability of the data in the register.

It should be noted that the register may comprise a set of memory cells that have the same basic design as the cells of the memory array. For example, both may use a six-transistor design as will be described in more detail below. The physical configuration of the transistors within the memory cells of the register, however, will be slightly different in order to achieve the more rapid stabilization of data within these memory cells than in the memory cells of the memory array. The different design of the memory cells of the register may require that these cells take up substantially more space than comparable cells within the memory array, but the additional space is required by the register cells is acceptable because only enough cells for a single register are necessary. That is, additional space is required for enough memory cells to store a single data word, as opposed to the number of memory cells required to store millions of data words.

In this embodiment, the memory system is configured so that, whenever a write operation is performed, the data is written to both the memory cell array (i.e., to the particular memory cells corresponding to the address identified by the write operation) and the register. The memory system is further configured so that, whenever a read operation is performed immediately after a write operation, the corresponding data will be read from either the memory cell array or the register, depending upon the address to which the read operation is directed. If the read address is the same as the preceding write address, the data is retrieved from the register. If the read address is different from the address identified in the preceding write operation, the data is retrieved from the memory cell array.

It should also be noted that the register is used here to more quickly stabilize the write data, in case the data will be read immediately after it is written. The register is located at or near the memory array and does not reduce the latency of the read or write operations. The register therefore differs from conventional cache systems (which are located closer to the processor than the memory array in order to reduce data latency) in both operation and physical configuration.

As noted above, one embodiment of the invention is implemented in conjunction with a memory that comprises an array of SRAM cells. Although the following detailed description will focus on this embodiment, it should be noted that alternative embodiments may be implemented with other types of memory cells for which a read of a particular memory cell should not be performed immediately after a write to that same cell.

One type of SRAM cell with which an embodiment of the invention may be useful is a simple, six-transistor SRAM cell that is known in the art. Before describing the embodiment of the invention that is used with this type of memory cell, it will be helpful to examine the structure and operation of the memory cell.

The structure of an exemplary SRAM memory cell in accordance with the prior art is illustrated in FIG. 1. Memory cell 100 is an example of one of the most simple SRAM memory cells. Memory cell 100 is formed by six transistors.

Two of the transistors, 121 and 122, are explicitly shown in FIG. 1. The other four transistors are embodied in inverters 111 and 112.

Inverters 111 and 112 are coupled together, front-to-back. That is, the input of each inverter is coupled to the output of the other inverter. The junction between the input of inverter 111 and the output of inverter 112 is identified in FIG. 1 as node A. The junction between the input of inverter 112 and the output of inverter 111 is identified in the figure as node B. These nodes may also be referred to herein as the data nodes of the memory cell. Each of nodes A and B is coupled to a corresponding one of bit lines 131 and 132 via transistors 121 and 122, respectively. The gate of each of these transistors (121 and 122) is coupled to a word line 140.

Transistors 121 and 122 are used to selectively couple or decouple the nodes (A and B) from the corresponding bit lines (131 and 132.) The voltage on word line 140 is transferred to the gates of transistors 121 and 122 to control whether these transistors are switched on or off, thereby coupling or decoupling the nodes from the bit lines. When the signal on word line 140 is low, transistors 121 and 122 are switched off, so that node A is decoupled from bit line 131 and node B is decoupled from bit line 132. When the signal on word line 140 is high, transistors 121 and 122 are switched on, so that node A is coupled to bit line 131 and node B is coupled to bit line 132.

It should be noted that the terms "high" and "low," as used to describe the voltages in the memory cell circuits of the present disclosure, refer to the range of voltages that are interpreted as a binary "1" and "0," respectively. These terms should not be construed to be limited only to Vdd and ground, respectively. These voltages may vary from one circuit design to another, as well be understood by one of skill in the art.

SRAM memory cell 100 operates as follows. When it is desired to store data in memory cell 100, appropriate voltages are applied to bit lines 131 and 132. In one embodiment, bit line 131 is considered the data line, while bit line 132 is considered the inverse data line, so voltages are applied to the lines in accordance with this scheme. In other words, if the data to be stored in memory cell 100 is a "1," the voltage on bit line 131 will be high, while the voltage on bit line 132 will be low. If the data to be stored is a "0," the opposite will be true—the voltage on bit line 131 will be low and the voltage on bit line 132 will be high.

In order to write data to memory cell 100 (i.e., store a bit value in the cell) a signal is asserted on word line 140. That is, the voltage on word line 140 will go high. This signal is applied to the gates of transistors 121 and 122, so when the signal is high, current can flow through the transistors. As a result, the voltages at data nodes A and B equalize with the respective ones of bit lines (131 and 132, respectively.) Thus, if bit line 131 is high and inverse bit line 132 is low, the voltage at node A is high, and the voltage at node B is low.

The signal on word line 140 is then deasserted (i.e., the signal goes low.) When this occurs, the voltages applied to the gates of transistors 121 and 122 go low, and the transistors are switched off. This decouples nodes A and B from bit lines 131 and 132. Consequently, current can no longer flow through transistors 121 and 122, so the data nodes (A and B) are electrically isolated from the bit lines. The voltages at the data nodes will therefore be retained, regardless of whether the voltages on bit lines 131 and 132 change.

It should be noted that the voltages retained at nodes A and B may not be exactly the same as the voltages that were on bit lines 131 and 132 when the signal on word line 140 was asserted. This is because inverters 111 and 112 are active devices. In other words, each of these inverters has a pair of transistors that alternately couple the respective outputs to a high voltage or a low voltage, and will drive the voltages at nodes A and B toward these high and low voltages. Thus, even if the voltages on bit lines 131 and 132 were only slightly different during a write operation, the voltages at nodes A and B would be driven to the respective high and low voltages after completion of the write operation (i.e., after the signal on word line 140 is deasserted.)

Memory cell 100 now stores data in the form of high and low voltages at data nodes A and B. In the foregoing example, the voltage at node A is high and the voltage at node B is low, corresponding to a stored "1." When it is desired to read the data out of memory cell 100, a read operation is performed. The read operation is very similar to the write operation, except that, rather than driving the voltages on bit lines 131 and 132 so that these voltages can be stored in the circuit out of memory cell 100, the bit lines are monitored to detect voltage changes that occur when they are coupled to data nodes A and B. this will be explained in more detail below.

In order to perform a read operation, the voltage on word line 140 is initially low. Transistors 121 and 122 are therefore switched off, and data nodes A and B are decoupled from bit lines 131 and 132. Bit lines 131 and 132 are then precharged to a high voltage (i.e., Vdd.) When the signal in word line 140 is asserted (i.e. the voltage on the line goes high) transistors 121 and 122 are switched on, coupling bit lines 131 and 132 to nodes A and B, respectively.

In the foregoing example, the write operation resulted in a high voltage at node A and a low voltage at node B, corresponding to a stored "1." The voltages at node A and on bit line 131 are therefore approximately the same (i.e., both are at about Vdd.) As a result, little or no current flows through transistor 121, and there is little or no change in the voltage on bit line 121. The voltage at node B, however, was low. Consequently, when transistor 122 is switched on, current flows from the higher voltage (Vdd) on bit line 132 to the lower voltage at node B. Because bit line 132 was only precharged to Vdd, and is not being driven to Vdd, the flow of current through transistor 122 causes the voltage on bit line 132 to drop. While this voltage drop may not be substantial, it is enough that a difference can be detected between this voltage and the voltage on bit line 131.

Bit lines 131 and 132 can be coupled to a sense amplifier that is configured to detect and amplify this voltage difference. Typically, the sense amplifier is designed to provide a high voltage (Vdd) on a data line corresponding to the higher of the two bit lines, and a low voltage (ground) on a data line corresponding to the lower of the two bit lines. A very small voltage difference between the bit lines is thereby amplified to the normal voltage difference (approximately Vdd) of a binary signal in the system in which the memory cell is implemented.

Figure 2:
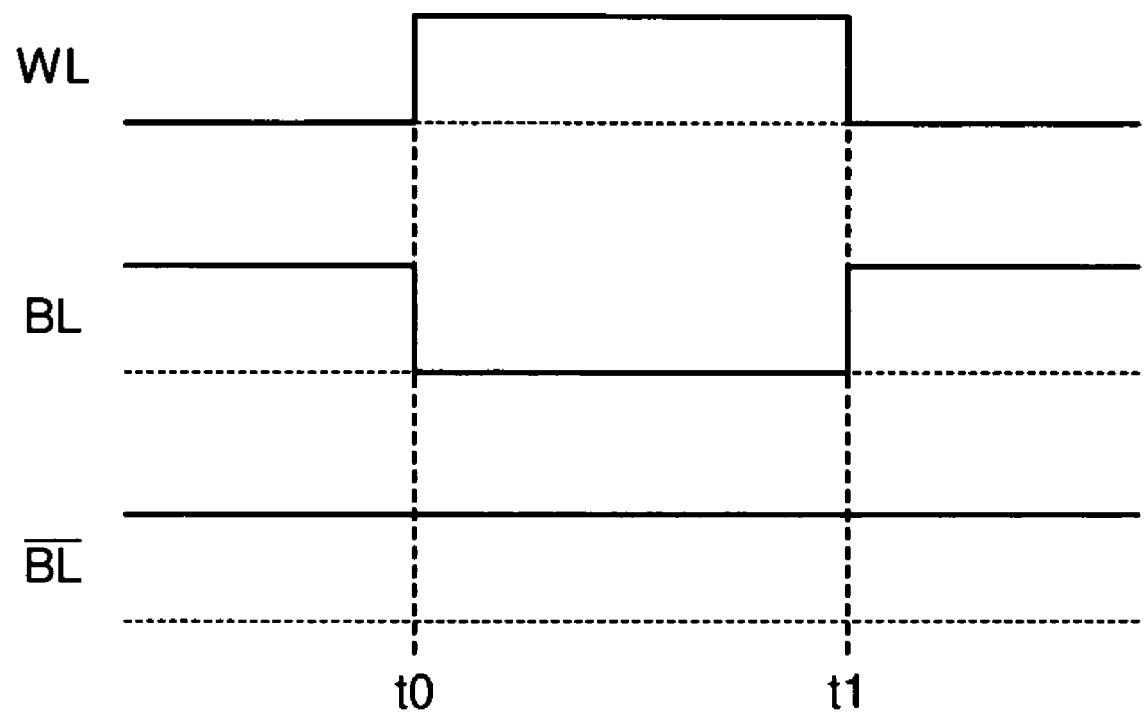
FIG. 2 is a diagram illustrating the signals on a word line and a pair of bit lines corresponding to a write operation in accordance with one embodiment.

Referring to FIG. 2, a diagram illustrating the signals on a word line (e.g., 140) and a pair of bit lines (e.g., 131 and 132) corresponding to a write operation in accordance with one embodiment is shown. In this figure, it can be seen that prior to a time t0, signal WL on the the word line is low (deasserted.) Prior to t0, the signals on the bit lines (BL and the inverse of BL) are both high because they are pre-charged to Vdd.

In this example, the value "0" will be written to the memory cell. Signal BL will therefore be low during the write operation, while the inverse of BL will be high. To write the data into the memory cell, signal WL on the write line is asserted (high) at time t0. This signal remains asserted until t1, at which time the signal is deasserted (low.) At time t1, signal BL and the inverse of BL are both precharged again to Vdd.

Figure 3:
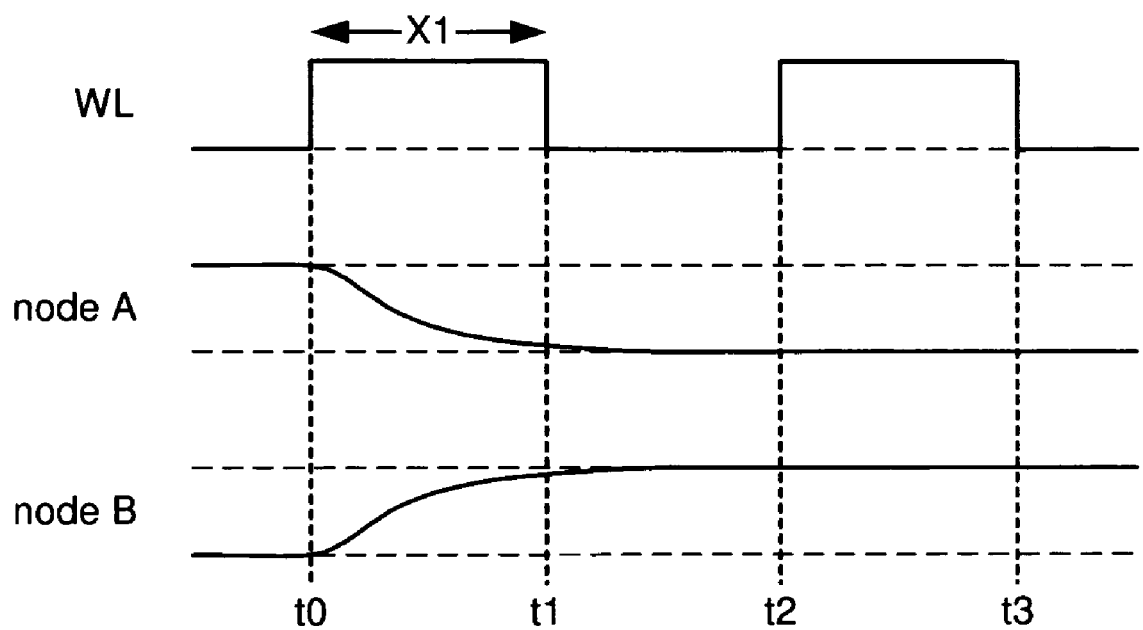
FIG. 3 is a diagram illustrating the voltages seen at the data nodes of a memory cell during a write operation in accordance with one embodiment.

Referring to FIG. 3, a diagram illustrating the voltages seen at nodes A and B of a memory cell during a write operation in accordance with one embodiment is shown. The write operation occurs between times t0 and t1, during a first processing cycle. It is assumed that, prior to the write operation, the memory cell stores a value of "1." That is, the voltage at node A is high, while the voltage at node B is low. The write operation will cause these voltages to be reversed, resulting in a low voltage at node A and a high voltage at node B.

It can be seen in FIG. 3 that when signal WL on the word line is asserted, the voltage at node A begins to be pulled from high to low. This is because, when signal WL is asserted, the transistors coupling the bit lines to nodes A and B are switched on, and the voltages at nodes A and B are pulled to the voltages on the bit lines (which, as shown in FIG. 2, are low and high, respectively.) In the embodiment illustrated by FIG. 3, signal WL is asserted at time t0, and the voltages at nodes A and B are pulled to the appropriate bit line voltages relatively quickly. That is, the node voltages are pulled almost all of the way to Vdd or ground by the time signal WL is de-asserted at time t1. The node voltages then stabilize at either Vdd or ground before signal WL is asserted again at time t2 during a second processing cycle. Because the node voltages have stabilized, a read operation may be performed during the second processing cycle without presenting any increased risk of corruption of the data as a result of the read operation.

Figure 4:
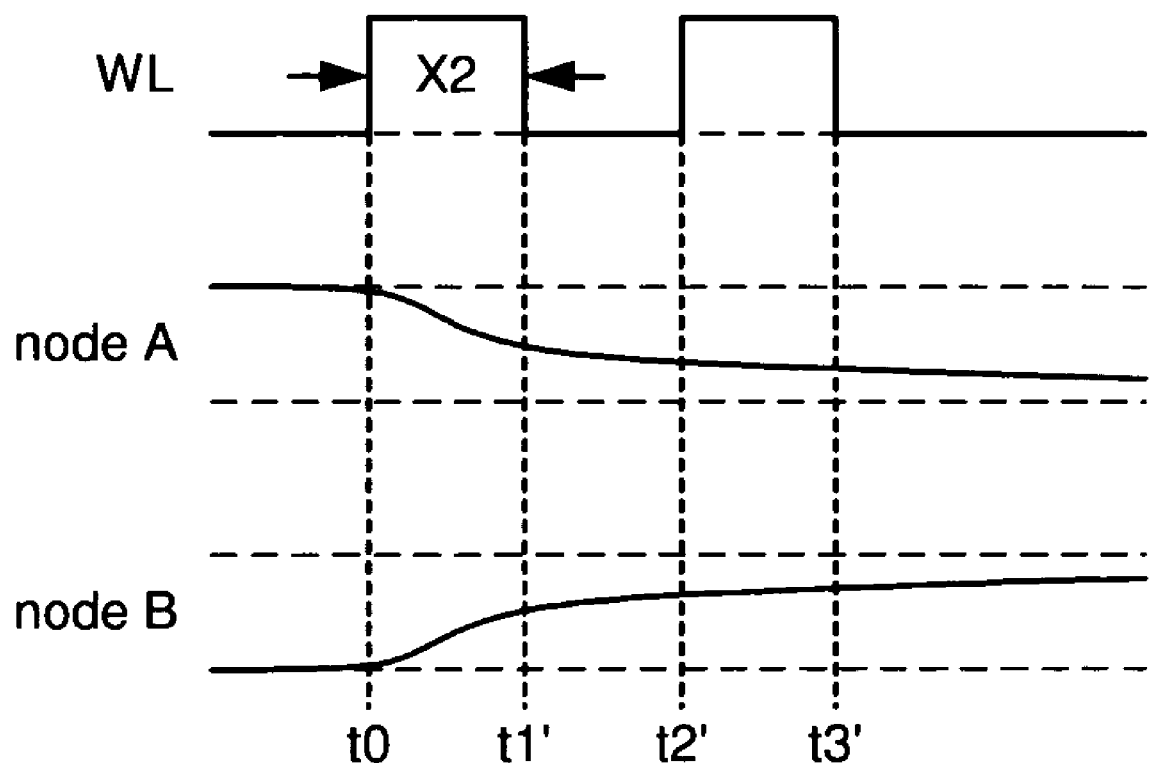
FIG. 4 is a diagram illustrating the voltages seen at the data nodes of a memory cell during a write operation in accordance with another embodiment.

Referring to FIG. 4, a diagram illustrating the voltages seen at nodes A and B of a memory cell during a write operation in accordance with another embodiment is shown. In this embodiment, the write operation occurs between times t0 and t1'. This shortened interval corresponds to a higher frequency or rate of operation than shown in FIG. 3. Again, prior to the write operation, the memory cell stores a value of "1," and the write operation will store a value of "0" in the memory cell. The configuration of the memory cell in this instance is assumed to be identical to the memory cell corresponding to FIG. 3, and the response characteristics of the memory cells (e.g., the rate at which the voltages at nodes A and B are pulled toward the new voltage levels) are assumed to be identical as well. The time scale in FIGS. 3 and 4 is also assumed to be the same.

As in FIG. 3, when signal WL is asserted at time t0, the transistors which couple the bit lines to nodes A and B begin to be pulled to the voltages on the respective bit lines. The voltages at nodes A and B begin changing at the same rate shown in FIG. 3 for times immediately following t0. In FIG. 4, however, signal WL is deasserted more quickly than in FIG. 3. Thus, while WL is asserted for an interval X1 in FIG. 3, this signal is asserted only for an interval X2 (t1'-t0) in FIG. 4. Because WL is asserted for a shorter interval, the voltages at nodes A and B do not have as much time to be pulled to their new voltage levels. As a result, when the transistors between nodes A and B and the respective bit lines are switched off at time t1', the voltages at nodes A and B are not as close to their final, intended values of ground and Vdd, respectively, as in the scenario of FIG. 3. Assuming the voltages at nodes A and B are closer to their intended values than their original values (at time t0), the voltages at the nodes will slowly stabilize at their intended values.

One of the problems with the higher-frequency operation shown in FIG. 4 is that, if a particular memory cell is written during a first processing cycle (e.g., from t0 to t1') the voltages at nodes A and B of the memory cell will not have stabilized at their intended levels by the time the next processing cycle occurs. If a read operation directed to the same memory cell occurs during this next processing cycle, the voltages at the nodes of the memory cell may not have stabilized enough to allow the value stored in the memory cell to be accurately determined. Further, the voltages at nodes A and B may be susceptible to changes that are induced by the read operation.

As noted above, a read operation on a memory cell such as the one illustrated and described in connection with FIG. 1 is performed by precharging both of the bit lines to Vdd, asserting the word line to switch on the transistors coupling the bit lines to the data nodes (A and B) allowing one of the bit lines to be pulled down by the voltage on the corresponding one of the data nodes (the node which is at ground) and then detecting and amplifying the difference between the bit lines using a sense amplifier.

In the scenario illustrated in FIG. 4, the voltages at nodes A and B have not yet stabilized at Vdd and ground. The voltages at the nodes may, for example, be ⅓ Vdd and ⅔ Vdd. Consequently, there may be only a very small difference in the amounts by which the bit lines are pulled down by the respective node voltages. Because the difference between the voltages on the bit lines is smaller than it would be in a scenario in which the data nodes were stabilized at Vdd and ground, this difference may not be sufficient to be accurately detected by a sense amplifier. The data read from the memory cell may therefore be inaccurate.

In addition to the potential inaccuracy that may arise from reading the memory cell before the data value in the cell has stabilized, the cell may be susceptible to being corrupted during a read operation. The reason the cell may be corrupted is that, when the transistors coupling the data notes to the bit lines are switched on, current is allowed to flow from the bit lines (which are at Vdd) to the data nodes if the voltages at the data nodes are lower. This not only causes the voltage on the bit line to drop, but also causes the voltage at the data node to rise.

In a perfect memory cell, where all of the components of the memory cell are perfectly matched, this increase in the voltage at the data node is not likely to have any substantial effect on the memory cell. The data node having the lower voltage would remain at a lower voltage, and the data node having the higher voltage would remain at a higher voltage, even though the voltage difference might become smaller. When the signal on the word line is deasserted, the data node would be decoupled from the bit line and the voltage at the data node would be driven back to ground.

Actual memory cells, however, are not perfect. As a practical matter, the transistors that form the memory cell may have variations in their respective responses that cause them not to be perfectly matched. For example, there is typically some variation from one transistor to another in the threshold voltages of the transistors. This is true, even when the transistors are identical in design.

Variations between the transistors (e.g., in threshold voltages) may, for example, cause the transistor coupling one bit line to its respective data node to turn on more strongly than the transistor coupling the other bit line to its data node. If the voltages at the data nodes are relatively close to each other (rather than having stabilized at Vdd and ground) the data node having the lower voltage may be more strongly coupled to its bit line and its voltage may consequently be pulled up more than that of the other data node. This may cause the data to be inverted.

It should be noted that variations between the transistors in a memory cell can become greater as the transistors become smaller. For example, the variation in the threshold voltages of the different transistors increases as the area of the channels in the individual transistors decreases. More specifically, the variation in threshold voltages is proportional to the inverse of the square root of the channel area:

$$\Delta V_{th} \alpha\ 1/(w*L)**\tfrac{1}{2}$$

Thus, as the size of SRAM cells decreases, the cells become more unstable and more susceptible to malfunctions.

The conventional approach to solving the problem of memory cells that do not stabilize quickly enough to allow data in the cells to be written in a first processing cycle and read in the next processing cycle is to either construct the cells using larger transistors (which have smaller variations in threshold voltages and are more stable) or reduce the speed at which the memory cells are operated so that sufficient time is provided for the data to stabilize in the cells. These conventional solutions, however, go against the demand for smaller and faster memory cells.

One embodiment therefore makes use of a first type of memory cells (e.g., smaller, less expensive, less stable cells) to construct an array of memory cells that may be able to store millions of data words, while at the same time making use of a second type of memory cells (e.g., bigger, more expensive, more stable cells) to construct a register that is only required to store a single data word (or possibly a few data words.) As noted above, the register is used to temporarily store data that is written to the array of memory cells so that, if data that was written to a particular location (memory cell) in one cycle has to be read from the same location in the next cycle, the data can be read from the register instead of the cell in the array.

Figure 5:
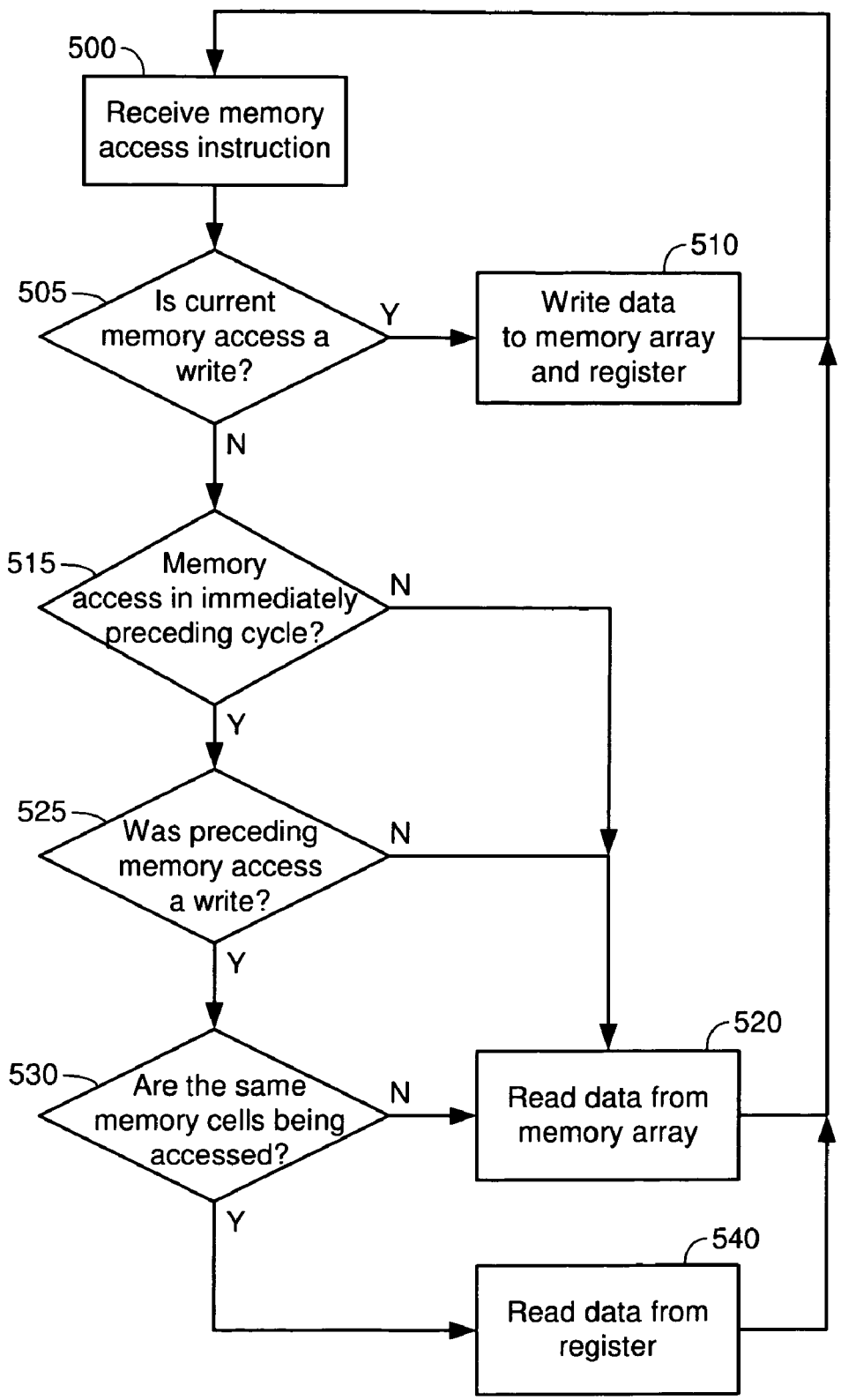
FIG. 5 is a flow diagram illustrating a method for handling accesses to a memory that includes an array of memory cells and a register in accordance with one embodiment.

Referring to FIG. 5, a flow diagram illustrating a method for handling accesses to a memory that includes an array of memory cells and a register in accordance with one embodiment is shown. Beginning at the top of the figure, when memory access instruction is received (block 500) it is first determined whether or not the access is a write operation (block 505.) If the memory access is a write, the write data is stored both at the identified address in the array of memory cells and in the register (block 510.) The system then waits to receive another memory access instruction (block 500.)

If the received memory access instruction is not a write instruction, but is instead a read instruction, it is determined whether there was a memory access operation that was performed in the immediately preceding cycle (block 515.) If there was no memory access in the immediately preceding cycle, then all of the data in the array of memory cells should be stable, and the data identified in the read instruction is retrieved from the array (block 520.)

If there was a memory access in the immediately preceding cycle, it is determined whether the preceding memory access was a write (block 525.) If the memory access was not a write, all of the data in the memory array should be stable, so the data is retrieved from the memory array (block 520.)

If the memory access in the preceding cycle was a write, it is determined whether the write access in the preceding cycle caused data to be written to any of the memory cells that would be read by the current read access. In one embodiment, this is accomplished by determining whether the address of the preceding memory access matches the read address of the current memory access (block 530.) If the read and write addresses are different, the read access is directed to a location in the memory array that should be stable, even though the data in the location corresponding to the preceding write may not be stable.

Finally, if the memory access in the preceding cycle was a write and it is determined that the write address is the same as the read address of the current memory access, the data corresponding to the current access (the read operation) is retrieved from the register (in which the data should already be stable) as opposed to the array of cells (in which the data may still be unstable) (block 540.)

It should be noted that the steps of the method depicted in FIG. 5 are merely exemplary. Alternative embodiments may implement a number of variations. For example, one alternative embodiment may perform similar steps, but in a different order. Another alternative embodiment might consolidate some of the illustrated steps. Still another alternative embodiment might divide some of the individual steps shown in figure into multiple steps, or might include additional steps. All of these variations are contemplated to be within the scope of this disclosure.

Figure 6:
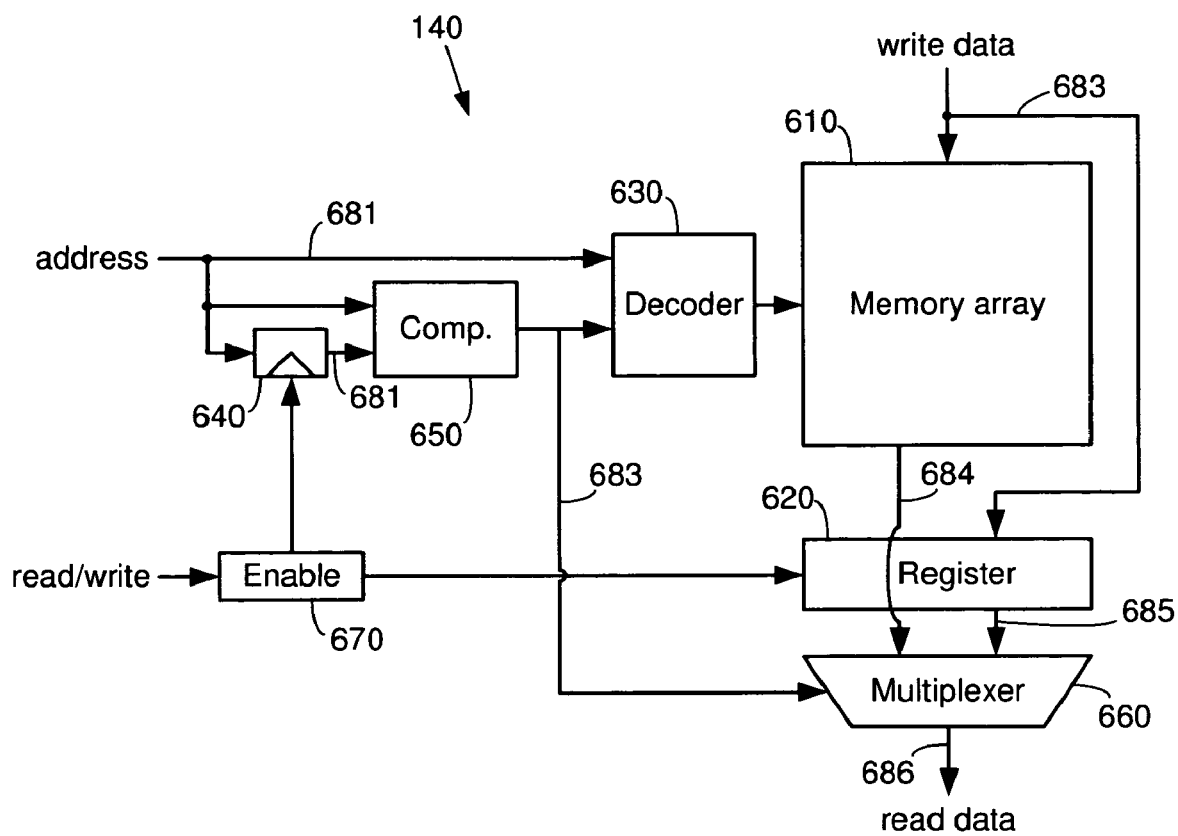
FIG. 6 is a functional block diagram illustrating an exemplary memory system in accordance with one embodiment.

Referring to FIG. 6, a functional block diagram illustrating an exemplary memory system in accordance with one embodiment is shown. The memory system depicted in this figure is configured to write data into an array of memory cells and into a register and read data from either the array of memory cells or the register, essentially in the manner described above with respect to FIG. 5. It should be understood that the structure illustrated in FIG. 6 is merely intended to illustrate one embodiment, and should not be considered to be limiting.

As depicted in FIG. 6, memory system 600 includes an array of memory cells 610 and a register 620, to which data can be written and from which data can be read. System 600 also has an address decoder 630 and control circuitry which includes a latch 640, a comparator 650, a multiplexer 660 and an enable signal generator 670.

Each of memory array 610 and register 620 includes a set of memory cells. Each of the memory cells stores a single bit of data. In this embodiment, memory array 610 is configured to store many data words, while register 620 is configured to store only a single word. While some embodiments of the invention may provide for only a few more entries in the memory array than in the register, it is contemplated that the present systems and methods will be more efficiently implemented with enough memory cells in the array to store many thousands or millions of data words. The register, the other hand need only store as much data as can be written at one time. For example, if a double-word (e.g., a long integer) can be written to the memory system, then the register should have enough memory cells to store a double-word.

As noted above, the characteristics of the memory cells used in memory array 610 are somewhat different than the characteristics of the memory cells used in register 620. In this embodiment, the memory cells used in memory array 610 are smaller and less expensive than the memory cells used in register 620. The memory cells used in memory array 610, however, require more time than the memory cells in register 620 for data written into the respective cells to stabilize. For example, in one embodiment, more than a single cycle, but less than two cycles for the data to stabilize in the cells of memory array 610. Data in the cells of register 620, the other hand, stabilizes within a single cycle. As a result, data can be safely and reliably read from the memory cells of register 620 in the cycle after the data is written to these cells. Data in the memory cells of array 610, however, cannot be safely and reliably read in the cycle after the data is written to these cells.

Data that is to be written into memory system 600 is received on line 680. The write data is provided simultaneously to both memory array 610 and register 620. Whenever data is written into memory array 610, the data is also written into register 620. When data is written to the memory system, a memory address is provided on line 681 corresponding to the write data on line 680. The address on line 681 is encoded (e.g., as a hexadecimal value) so this address is provided to decoder 630. Decoder 630 decodes the address and provides the decoded value (e.g., a binary value) to memory array 610. The decoded address determines the memory location (i.e., the specific memory cells in array 610) in which the write data on line 680 will be stored.

As noted above, each time data is written into memory array 610, that same data is written into register 620. Each time data is written into register 620, that data replaces the data that was previously stored in the register. Consequently, there is no need to provide the memory address associated with the write data to register 620. It may be necessary in some embodiments, however, to provide an indication of the type of data word that is being stored in the register. For example, it may be necessary to indicate whether the data word is a normal-length word (e.g., 32 bits) a short word (16 bits) or a long word (64 bits) in order to ensure that, if the data is later read from the register, only the valid data bits are read.

In the embodiment illustrated in FIG. 6, enable signal generator 670 is provided to control the storage of data in register 620, as well as to control the storage of the corresponding address in latch 640. An enable signal is generated by enable signal generator 670 whenever a write operation is performed by memory system 600. It is necessary in this embodiment to store the address associated with the data in latch 640 so that the address can be compared to the address used in a subsequent read operation. Just as the write data in register 620 is replaced by data from subsequent write operations, the address data in latch 640 is replaced by address data from the subsequent write operations.

When a read operation is performed in system 600, the memory address is provided on line 681. Since it is not a write operation, the enable signal provided by enable signal generator 670 remains deasserted. Consequently, latch 640 retains the address from the previous write operation, and register 620 retains the data from the previous write operation. During the read operation, comparator 650 receives the read address on line 681 and the address from the previous write operation on line 682. Comparator 650 determines whether these two addresses are the same and either asserts or deasserts a comparison signal on line 683. The comparison signal on line 683 is provided to decoder 630 and multiplexer 660.

If the read and write addresses are different, comparator 650 deasserts the signal on line 683. The deasserted signal causes decoder 630 to decode the read address normally and to provide the decode address to memory array 610. The signal on line 683 is used by multiplexer 660 as a select input, and the deasserted signal causes multiplexer 660 to select the data value on line 684 to be output as the read data on line 686. This data is the data stored at the location in memory array 610 indicated by the decode address received from decoder 630.

If, on the other hand, the read and write addresses are the same, comparator 650 asserts the signal on line 683. The asserted signal on line 683 causes multiplexer 660 to select the value on line 685 to be output as the read data on line 686. The data value on line 685 is the last data written to register 620 (as well as to memory array 610.) The asserted signal on line 683 may also cause decoder 630 to inhibit the decoding of the read address.

In system 600, multiplexer 660 is controlled by the comparison signal on line 683. Thus, the data provided by system 600 during a read operation will be retrieved from register 620 whenever the address of the read operation matches the address of the last write operation. As discussed above, if the read operation is performed more than one cycle after the preceding write operation, the data stored in memory array 610 by the write operation should have had time to stabilize in the corresponding memory cells. Consequently, the read data may be provided from memory array 610. Alternative embodiments may therefore provide control circuitry to retrieve the data for the read operation from memory array 610 instead of register 620.

The foregoing description focuses on a few exemplary embodiments. It should be noted that many variations on these embodiments may be apparent to that is of skill in the art of the invention upon reading this disclosure. Possible variations may, for example, include alternative configurations of the control circuitry used to determine whether data is read from the memory array or the register, different numbers of data values that are stored in the register, different means for determining whether the data in the memory array has stabilized, different numbers of cycles allowed for data to stabilize, different means for determining whether read and write operations involve the same memory cells, and so on. Such variations are contemplated to the within the scope of the claims set forth below.

Those of skill in the art will understand that information and signals may be represented using any of a variety of different technologies and techniques. For example, data, instructions, commands, information, signals, bits, symbols, and the like that may be referenced throughout the above description may be represented by voltages, currents, electromagnetic waves, magnetic fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such a storage medium containing program instructions that embody one of the present methods is itself an alternative embodiment of the invention. One exemplary storage medium may be coupled to a processor, such that the processor can read information from, and write information to, the storage medium. In the alternative, the storage medium may be integral to the processor. The processor and the storage medium may reside, for example, in an ASIC. The ASIC may reside in a user terminal. The processor and the storage medium may alternatively reside as discrete components in a user terminal or other device.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A memory system comprising:
an array of memory cells of a first type;
a register having memory cells of a second type, wherein the second type of memory cells stabilize voltage levels corresponding to data therein more quickly than the first type of memory cells; and
control circuitry coupled to the array and the register, wherein the control circuitry concurrently writes identical data into memory cells of the array and memory cells of the register, and to read data from the register when a read operation is directed at least in part to a memory location to which a preceding write operation was directed, wherein the control circuitry reads the data only from the register when the read operation is performed in a second processing cycle immediately following a first processing cycle in which the write operation is performed, and wherein the control circuitry reads the data only from the array when a second read operation is performed in a third processing cycle immediately following the second processing cycle.

2. The memory system of claim 1, wherein the control circuitry reads the data only from the register when a second read operation is performed in a third processing cycle immediately following the second processing cycle.

3. The memory system of claim 1, wherein the first type of memory cells comprise SRAM cells.

4. The memory system of claim 1, wherein each memory cell of the second type is larger than each memory cell of the first type.

5. The memory system of claim 1, wherein the control circuitry comprises a multiplexer that receives a first data input from the array and a second data input from the register.

6. The memory system of claim 1, wherein the first type of memory cells require a first amount of time for voltages corresponding to data written therein to stabilize, wherein the first amount of time is greater than a minimum interval between successive memory accesses.

7. The memory system of claim 6, wherein the second type of memory cells require a second amount of time for voltages corresponding to data written therein to stabilize, wherein the second amount of time is less than the minimum interval between successive memory accesses.

8. The memory system of claim 1, wherein the control circuitry comprises a comparator that compares a first address associated with the read operation to a second address associated with the preceding write operation.

9. The memory system of claim 8, wherein the control circuitry further comprises a latch that stores the second address.

10. The memory system of claim 1:
wherein the control circuitry comprises
a multiplexer that receives a first data input from the array and a second data input from the register,
a comparator that compares a first address associated with the read operation to a second address associated with the preceding write operation, and
a latch that stores the second address when the preceding write operation is performed;
wherein the first type of memory cells comprise SRAM cells that require a first amount of time for voltages corresponding to data written therein to stabilize and the second type of memory cells comprise SRAM cells that require a second amount of time for voltages corresponding to data written therein to stabilize, wherein the first amount of time is greater than a minimum interval between successive memory accesses and the second amount of time is less than the minimum interval between successive memory accesses.

11. A method comprising:
in a first processing cycle, performing a write operation, wherein performing the write operation includes storing data in a first set of memory cells in a memory array and concurrently storing the data in a register, wherein the register stabilizes voltages corresponding to data stored therein more quickly than the memory cells in the memory array; and
in a second processing cycle immediately following the first processing cycle, performing a read operation, wherein
when the read operation is directed to one or more of the first set of memory cells in the memory array, the data is read only from the register, and
when the read operation is not directed to one or more of the first set of memory cells in the memory array, the data is read only from the memory array;
in a third processing cycle immediately following the second processing cycle, performing a read operation, wherein
when the read operation is directed to one or more of the first set of memory cells in the memory array, the data is read only from the memory array.

12. The method of claim 11, further comprising performing a read operation in a third processing cycle that immediately follows the second processing cycle, wherein the read operation in the third processing cycle reads the corresponding data only from the register.

13. The method of claim 11, wherein the read operation is performed before voltages corresponding to the data have stabilized in the first set of memory cells in a memory array.

14. The method of claim 11, further comprising determining whether the read operation is directed to one or more of the first set of memory cells in the memory array.

15. The method of claim 14, wherein determining whether the read operation is directed to one or more of the first set of memory cells in the memory array comprises comparing a write address associated with the write operation with a read address associated with the read operation.

* * * * *